United States Patent

Sugibayashi

[11] Patent Number: 6,018,492
[45] Date of Patent: Jan. 25, 2000

[54] SEMICONDUCTOR MEMORY DEVICE

[75] Inventor: Tadahiko Sugibayashi, Tokyo, Japan

[73] Assignee: NEC Corporation, Tokyo, Japan

[21] Appl. No.: 09/073,837

[22] Filed: May 6, 1998

[30] Foreign Application Priority Data

May 6, 1997 [JP] Japan .................................. 9-115731

[51] Int. Cl.[7] ............................................ G11C 8/00
[52] U.S. Cl. .................... 365/233; 365/189.08; 365/208; 365/63; 365/68
[58] Field of Search .................... 365/233, 212, 365/221, 230.03, 205, 194, 189.08, 103, 208, 63; 357/74; 364/489

[56] References Cited

U.S. PATENT DOCUMENTS

| | | |
|---|---|---|
| 4,866,508 | 9/1989 | Eichelberger et al. .................... 357/74 |
| 5,208,782 | 5/1993 | Sakuta et al. ....................... 365/230.03 |
| 5,446,675 | 8/1995 | Yoshimura .............................. 364/489 |

OTHER PUBLICATIONS

"ISSCC95 / Session 14 / DRAM / Paper FA 14.6" *IEEE International Solid–State Circuits Conference* pp. 254–254 (1995).

*Primary Examiner*—David Nelms
*Assistant Examiner*—Thong Le
*Attorney, Agent, or Firm*—Foley & Lardner

[57] ABSTRACT

A semiconductor memory device is grouped into a plurality of flexible macro chips. Under the circumstances, a clock input first stage circuit is arranged in a first flexible macro chip to supply an internal reference clock signal and a first internal clock signal in response to an external reference clock signal. Further, a group of command input first stage circuits are collectively arranged in a second flexible macro chip different from the first flexible macro chip. In this event, the the first internal clock signal is directly supplied to the command input first stage circuits so as to input a command signal.

15 Claims, 15 Drawing Sheets

SEMICONDUCTOR MEMORY DEVICE

BACKGROUND OF THE INVENTION

This invention relates to a semiconductor memory device.

A semiconductor memory device, such as a DRAM (Dynamic Random Access Memory), has been recently developed. In such a semiconductor memory device, a command signal, an address signal, and a data signal are input and output in synchronism with an external reference clock signal.

Herein, disclosure has been made about the DRAM to enhance a yield in 1995 ISSCC DIGEST of Technical Papers, pages 254–255. In the above DRAM, one memory chip is structured by a plurality of flexible macro chips. Herein, the flexible macro chip may be called a flexible macro or a sub-chip. In the flexible macro chip, the function can be changed by cutting fuses.

Conventionally, the DRAM of 1 G bit is generally structured by the use of four flexible macro chips. In this event, one of the flexible macro chips is given the external reference clock signal. The external reference clock signal is distributed into the respective flexible macro chips as internal reference clock signals on the basis of a tree structure. Herein, the tree structure is formed by a plurality of clock buffers. In this tree structure, a clock input first stage circuit is arranged in one of the flexible macro chips.

As mentioned before, the above DRAM adopts the flexible multi-macro system. Consequently, each of the flexible macro chips must normally operate even when the flexible macro chip is placed at any positions in the memory chip. Therefore, although all of the clock buffers not may always be used, unused buffers may be inactivated in response to signals which are determined by cutting the fuses.

Further, a command input first stage circuit is arranged in each of the flexible macro chips. The command input first stage circuit is driven by the internal reference clock signal. Namely, the above internal reference clock signal is given to the command input first stage circuit to input the command signal and the address signal in synchronism with the external reference clock signal.

The command signal is given to the command input first stage circuit in each of the flexible macro chips. The command signal is sequentially supplied to the buffers along a tree structure.

In this case, when the internal clock signal is always operated, a standby current is inevitably increased. To this end, a "low" level of a chip enable signal is detected at a rise clock of the external reference clock signal. Thereby, the chip is activated and thereafter, the internal reference clock signal is operated.

Specifically, a first flip-flop circuit is provided to latch the detection state of the chip enable signal. Consequently, the internal reference clock signal of a first cycle is operated after the output node of the first flip-flop circuit is put into a "low" level. Therefore, the width of the internal reference clock signal of the first cycle inevitably becomes narrow with a reverse time of the first flip-flop as compared to the width of the internal clock signal of the second cycle and later.

In the above conventional example, when the command input first stage circuit is driven by the use of the internal reference clock signal, a signal path between the clock input first stage circuit and each of the clock buffers in each macro has large parasitic resistance and capacitance. This causes a bottle-neck for achieving a minimum cycle time. Herein, if a flip-flop circuit is arranged in the course of the path to eliminate the above bottle neck, the memory chip is enlarged in size and further, the number of access cycles is also increased.

Further, when the internal reference clock signal is generated only in an operation cycle, and the flip-flop is arranged in the clock input first stage circuit to reduce the consumption current during the standby operation, an output of the internal clock signal is delayed, and the clock width of the first clock cycle of the internal clock signal inevitably becomes narrow. Consequently, an operation margin is largely reduced.

SUMMARY OF THE INVENTION

It is therefore an object of this invention to provide a semiconductor memory device which is capable of reducing a minimum clock time without an increase of a chip size.

According to this invention, a semiconductor memory device is grouped into a plurality of flexible macro chips. Under the circumstances, a clock input first stage circuit is arranged in a first flexible macro chip to supply an internal reference clock signal and a first internal clock signal in response to an external reference clock signal. Further, a group of command input first stage circuits are collectively arranged in a second flexible macro chip different from the first flexible macro chip. In this event, the first internal clock signal is directly supplied to the command input first stage circuits so as to input a command signal.

More specifically, the minimum clock cycle time can be reduced because the first internal clock signal is directly supplied to the command input first stage circuits. Further, the internal reference clock signal may be halted to suppress a current during a standby operation. Moreover, the operation margin is not degraded because the width of the internal clock does not become narrow.

DESCRIPTION OF THE PREFERRED EMBODIMENTS

Referring to FIGS. 1 through 5, a conventional semiconductor memory device will be first described for a better understanding of this invention. The semiconductor memory device is equivalent to the conventional semiconductor memory device mentioned in the preamble of the instant specification.

Figure 1:
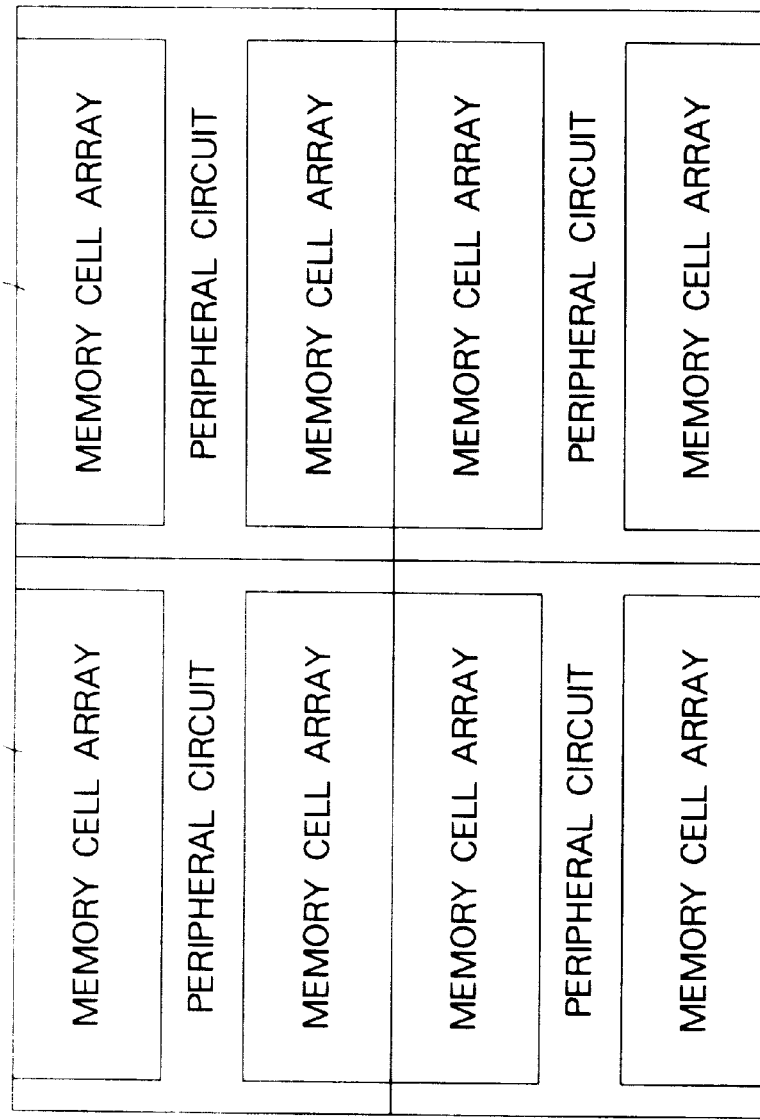
FIG. 1 is a layout showing a chip structure of a conventional semiconductor memory device.

As illustrated in FIG. 1, one chip of the DRAM (for example, 1 G bit DRAM) is structured by four flexible macro chips (for example, 256 M bit) 101 through 104. In this case, each of the flexible macro chips 101 through 104 can change the function by cutting fuses. Further, each of the flexible macro chips 101 through 104 includes two memory cell arrays and a peripheral circuit, as illustrated in FIG. 1.

Figure 2:
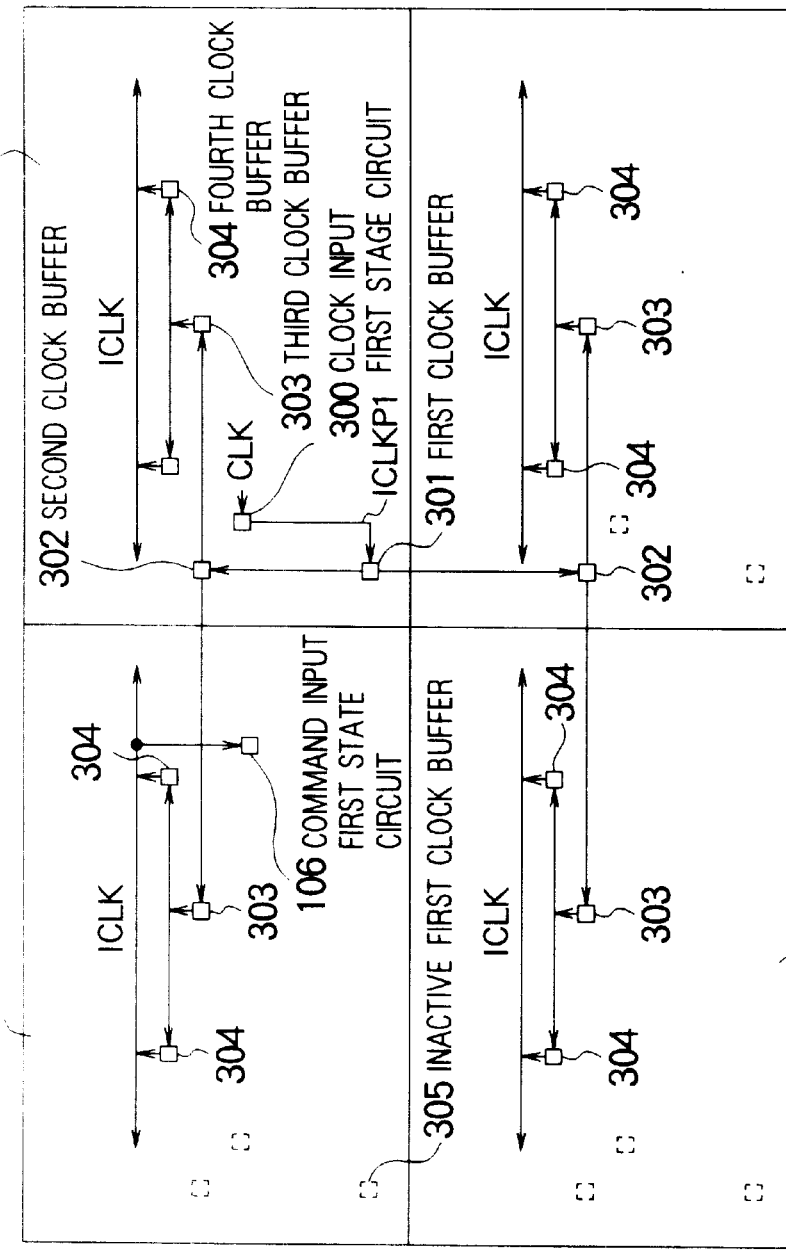
FIG. 2 is a block diagram showing a transmission path of an internal reference clock signal of a conventional semiconductor memory device.

As shown In FIG. 2, a clock input first stage circuit 300 is arranged in the flexible macro chip 101. In this event, an external reference clock signal CLK is given to the clock input first stage circuit 300. This external reference clock signal CLK is distributed into each of the flexible macro chips 101, 102, 103 and 104 as internal reference clock signals ICLK. Specifically, the external reference clock signal CLK is supplied into the respective flexible macro chips 101, 102, 103 and 104 via a plurality of clock buffers as the internal reference clock signals ICLK. Herein, the clock buffers constitutes a tree structure, as illustrated in FIG. 2.

More specifically, the the external clock reference signal CLK from the clock input first stage circuit 300 is supplied to a first clock buffer 301 as the internal reference clock signal ICLK. The internal reference clock signal ICLK is supplied from the first clock buffer 301 into second clock buffers 302. Further, the internal reference clock signals ICLK are supplied from the second clock buffers 302 into third clock buffers 303. Finally, the internal reference clock signals ICLK are supplied from the third clock buffers 303 to fourth clock buffers 304. Thus, the external reference clock signal CLK from the clock input first stage circuit 300 is supplied to the respective flexible macros 102 through 104 via the first, second, third and fourth clock buffers 301, 302, 303 and 304 of the tree structure.

Moreover, a command input first stage circuit 106 is arranged in each of the flexible macro chips 101 through 104. The command input first stage circuit 106 is driven by the internal clock signal ICLK to input command signal and address signal in synchronism with the external reference clock signal CLK, as shown in FIG. 2

As mentioned above, the DRAM adopts the flexible multi-macro system. Consequently, each of flexible macro chips 101 through 104 must normally operate regardless where the flexible macro chips 101 through 104 are arranged in the memory chip. Therefore, although all of the clock buffer not may always be used, unused buffers (for example, inactive first clock buffers 305) are inactivated in response to signals which are determined by cutting the fuses, as illustrated in FIG. 2.

Figure 3:
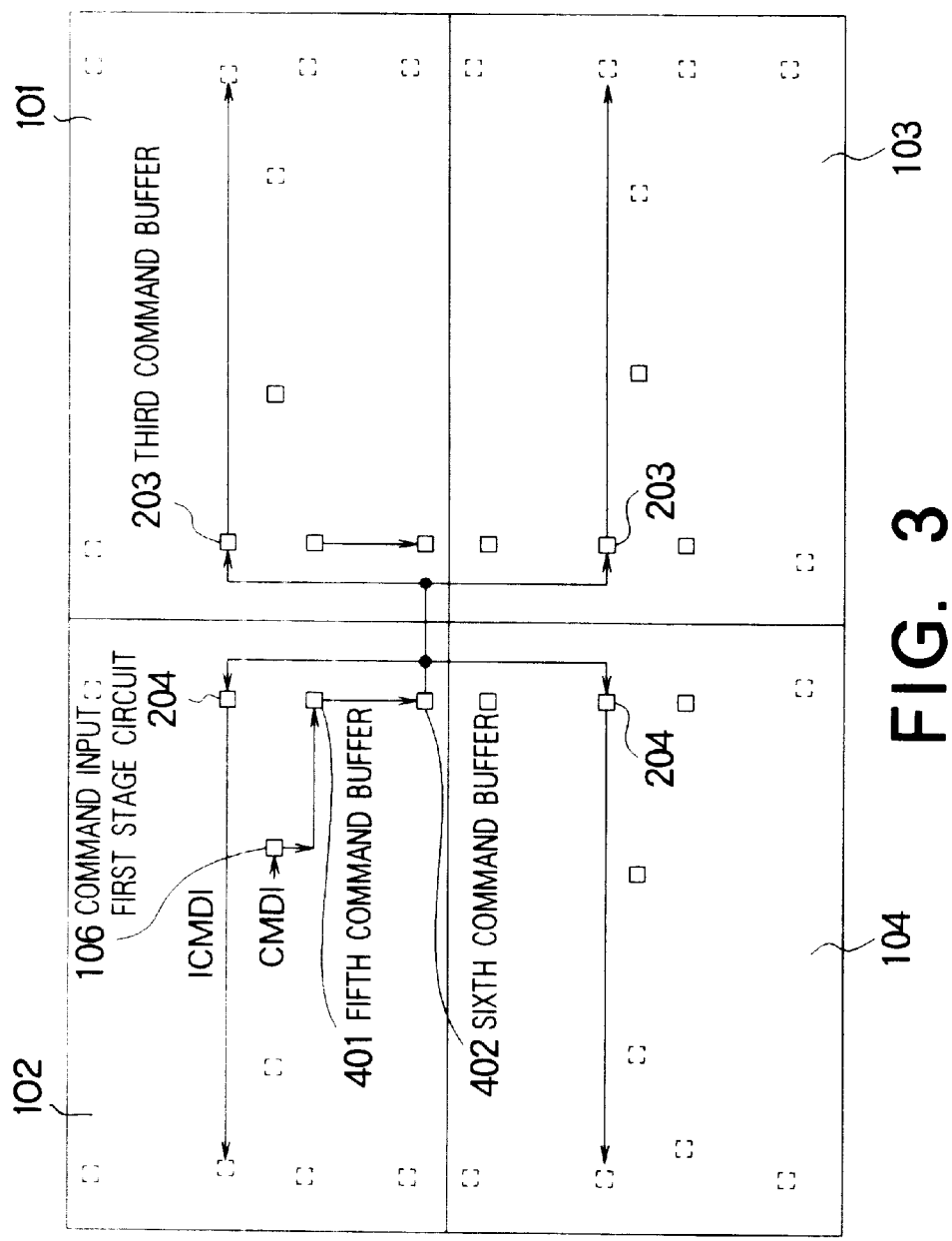
FIG. 3 is a block diagram showing a transmission path of a command signal of a conventional semiconductor memory device.

Subsequently, description will be made about a conventional transmission path, referring to FIG. 3.

The command input first stage circuit 106 is arranged in each of the flexible macro chips 101 through 104. A command signal CMDi is given to the command input first stage circuit 106. In this event, the command input first stage circuit 106 is driven by the internal reference clock signal ICLK illustrated in FIG. 2.

Specifically, the command signal CMDi from the command input first stage circuit 106 is supplied into the respective flexible macro chips 101, 102, 103 and 104 via a plurality of command buffers. Herein, the clock buffers constitutes a tree structure, as illustrated in FIG. 3.

Namely, the command signal CMDi from the command input first stage circuit 106 is supplied to a fifth command buffer 401. The command signal CMDi is supplied from the fifth command buffer 401 to a sixth command buffer 402. Further, the command signal CMDi is supplied from the sixth command buffer 402 into fourth command buffers 204 in the flexible macro chips 102 and 104. On the other hand, the command signal CMDi is supplied from the sixth command buffer 402 into third command buffers 203 in the flexible macro chips 101 and 103.

Thus, the command signal CMDi from the command input first stage circuit 106 is supplied to the respective flexible macro chips 101 through 104 via the fifth, sixth, fourth and third command buffers 401, 402, 204 and 203 of the tree structure.

In this event, internal command signals ICMDi is driven by the fourth clock buffers 204 in the flexible macro chip 102 and 104 or the third clock buffers 203 in the flexible macro chips 101 and 103.

Subsequently, description will be made about the structure the conventional clock input first stage circuit 300, referring to FIG. 4 together with a timing chart illustrated in FIG. 5.

Figure 4:
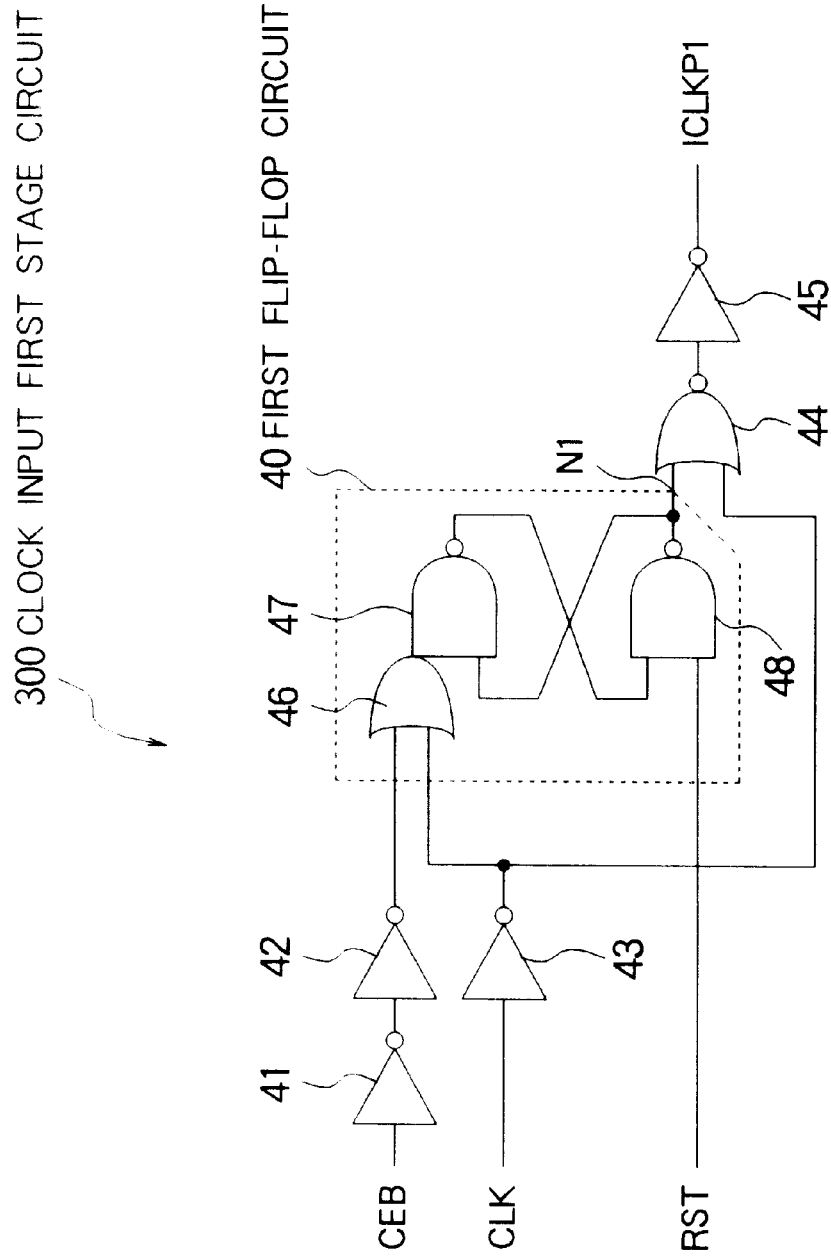
FIG. 4 is a circuit diagram showing a clock input first stage circuit in a conventional semiconductor memory device.

As shown in FIG. 4, the clock input first stage circuit 300 includes a first flip-flop circuit 40, inverter circuits 41, 42, 43 and 45 and a NOR circuit 44, as illustrated in FIG. 4. In this event, the first flip-flop circuit 40 is composed of an OR circuit 46, NAND circuits 47 and 48.

With such a structure, a chip enable signal CEB is given to the first flip-flop circuit 40 via the inverter circuits 41 and 42. Further, the external reference clock signal CLK is given to the first flip-flop 40 via the inverter circuit 43. Moreover, a reset signal RST is given to the first flip-flop 40. The first flip-flop 40 supplies the internal clock signal ICLKP1 via the NOR circuit 44 and the inverter circuit 45.

In this case, when the internal reference clock signal ICLK is always operated, a standby current is inevitably increased. To this end, a "low" level of a chip enable signal CEB is detected at a rise clock of the external reference clock signal CLK, as shown in FIG. 5. Thereby, the memory chip is activated and thereafter, the internal reference clock signal ICLK is operated, as illustrated in FIG. 5.

More specifically, the first flip-flop circuit 40 is provided to latch the detection state of the chip enable signal CEB, as illustrated in FIG. 4. Consequently, the internal reference clock signal ICLK of the first cycle is operated after the output node NI of the first flip-flop circuit 40 is put into a "low" level, as shown in FIG. 5. Therefore, the width of the internal reference clock signal ICLK of the first cycle becomes narrow with a reverse time of the first flip-flop circuit 40 as compared to the width of the internal reference clock signal ICLK of a second cycle and later, as illustrated in FIG. 5.

In the above conventional example, the command input first stage circuit 106 is driven by the use of the internal reference clock signal ICLK. In this event, a signal path between the command input first stage circuit 106 and each of the third command buffers 203 in the flexible macro chip 101 and 103 has large parasitic resistance and capacitance, as shown in FIG. 3. This causes a bottle-neck for achieving the minimum cycle time.

Figure 5:
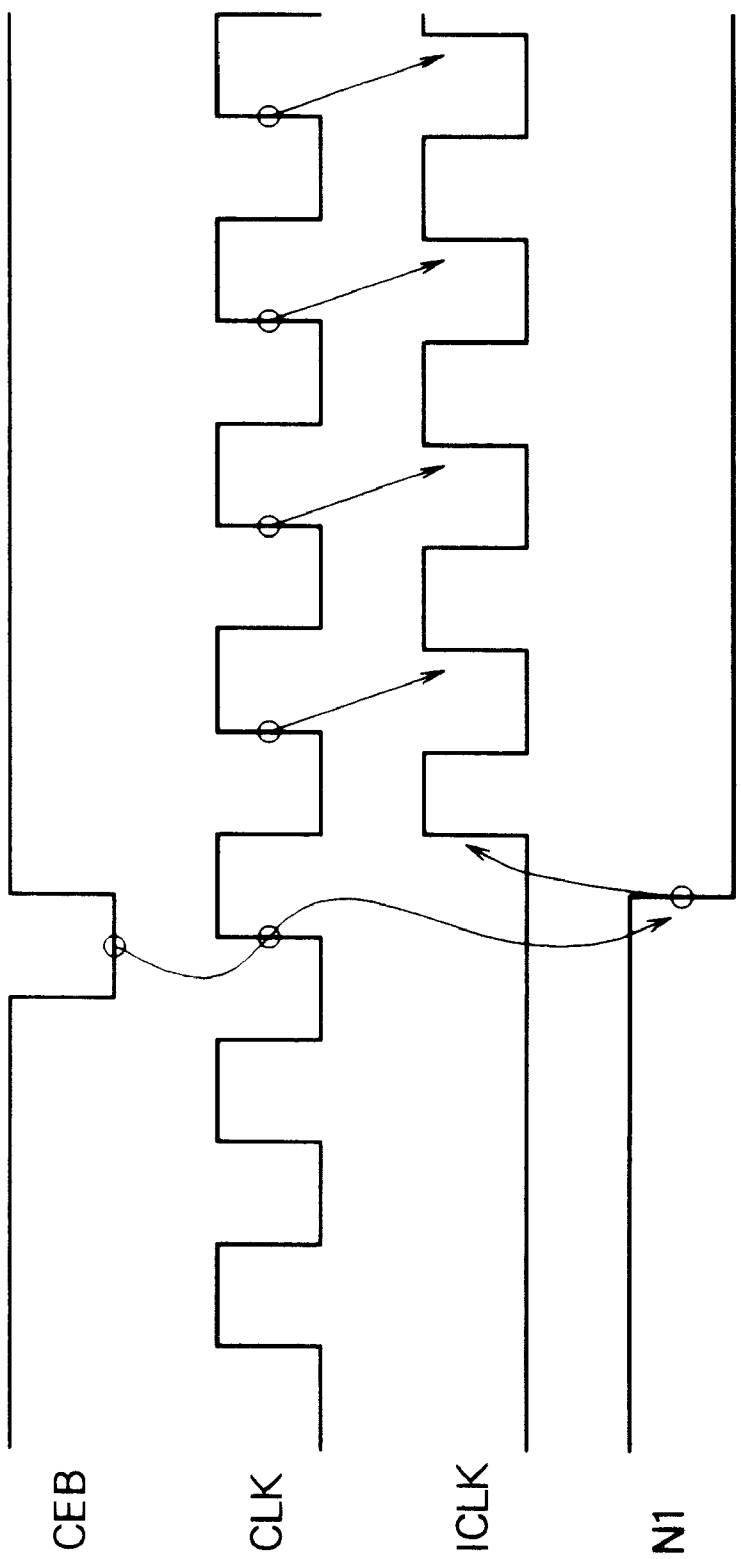
FIG. 5 is a timing chart of the clock input first stage circuit illustrated in FIG. 4.

Further, when the internal reference clock signal ICLK is generated only in an operation cycle, and the first flip-flop circuit 40 is arranged in clock input first stage circuit 300 to reduce the consumption current during the standby operation, an output of the internal reference clock signal ICLK is delayed, and the clock width of the first clock cycle of the internal reference clock signal signal ICLK becomes narrow, as illustrated in FIG. 5. Consequently, the operation margin is largely reduced.

Taking the above-mentioned problems into consideration, this invention provides a semiconductor memory device which is capable of reducing a minimum clock time without an increase of the chip size.

Principle of this Invention

Figure 6:
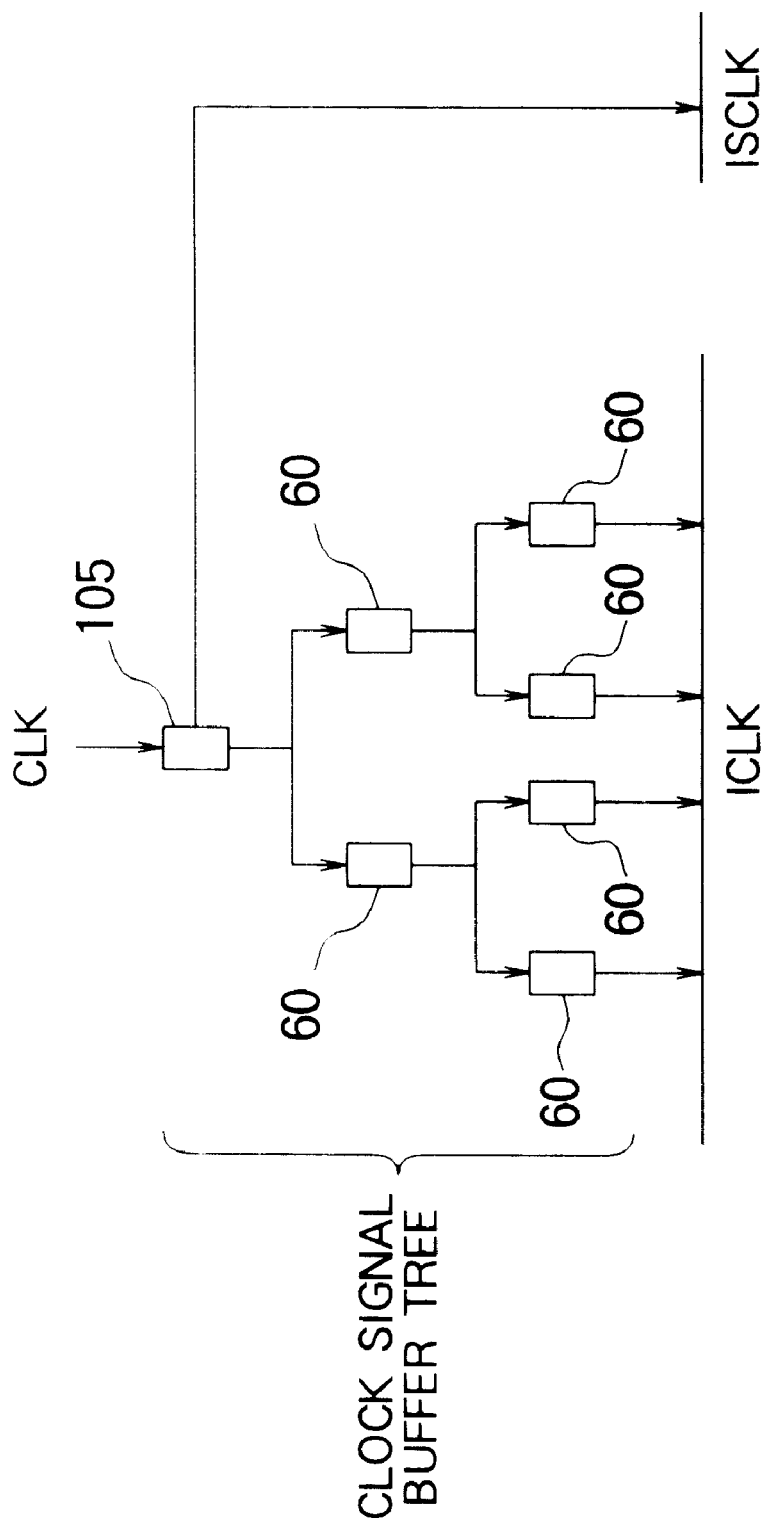
FIG. 6 is a block diagram showing a principle of this invention.

Referring to FIG. 6, description will first be made about a principle of this invention.

An external reference clock signal CLK is given to a clock input first stage circuit 105. The external reference clock signal CLK is distributed into a plurality circuits (not shown) via a plurality of clock buffers 60 as internal reference clock signals ICLK. Herein, the clock buffers 60 constitutes a tree structure, as illustrated in FIG. 6.

In this event, a skew of the internal reference clock signal is required to be as small as possible. Therefore, the external reference clock signal CLK is supplied via a plurality of clock buffers 60 in the semiconductor memory device having a large chip size by the use of the flexible multi-macro system.

On the other hand, a first internal clock signal ISCLK is outputted from the clock input first stage circuit 105 in addition to the internal reference clock signal ICLK, as shown in FIG. 6.

First Embodiment

Subsequently, description will be made about a semiconductor memory device according to a first embodiment of this invention, referring to FIGS. 7 through 10.

Figure 7:
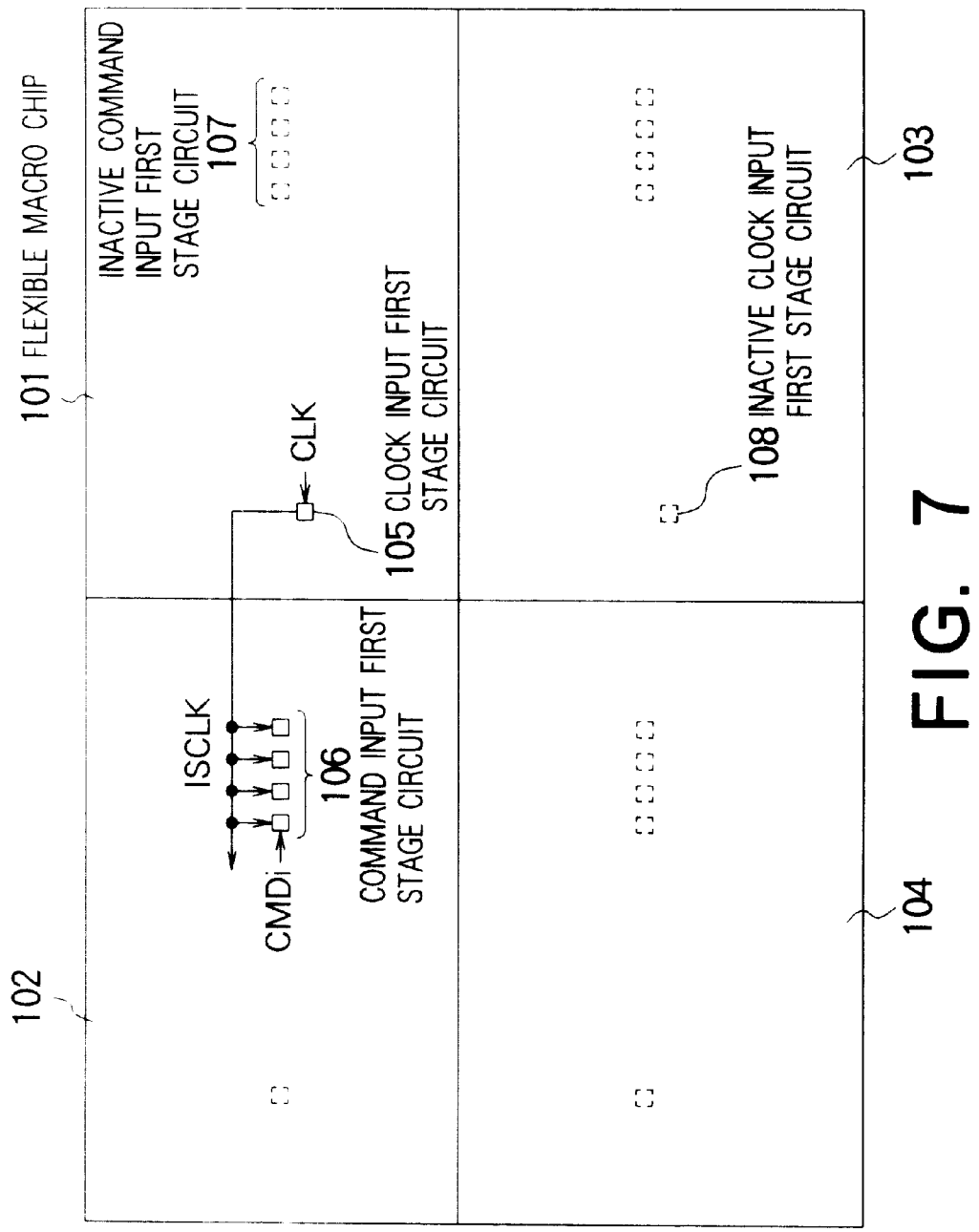
FIG. 7 is a block diagram showing a transmission path of an first clock signal according to a first embodiment of this invention.

The first internal clock signal ISCLK from the clock input first stage circuit 105 is directly supplied to only command input first stage circuits 106, as illustrated in FIG. 7. Herein, the command input first stage circuits 106 are collectively arranged in one flexible macro chip 102 among a plurality of the flexible macro chips 101 through 104. In this event, the number of the clock buffers is largely reduced by collectively arranging the four command input first stage circuits 106 in one flexible macro chip 102. Consequently, the delay of the clock is also largely reduced as compared to the conventional structure illustrated in FIG. 2. Namely. the first internal clock signal ISCLK quickly reaches the command input first stage circuits 106 as compared to the conventional structure. This is because the first internal clock signal ISCLK is not required to pass a plurality of clock buffers towards the command input first stage circuit 106, like the signal path illustrated in FIG. 2

Figure 8:
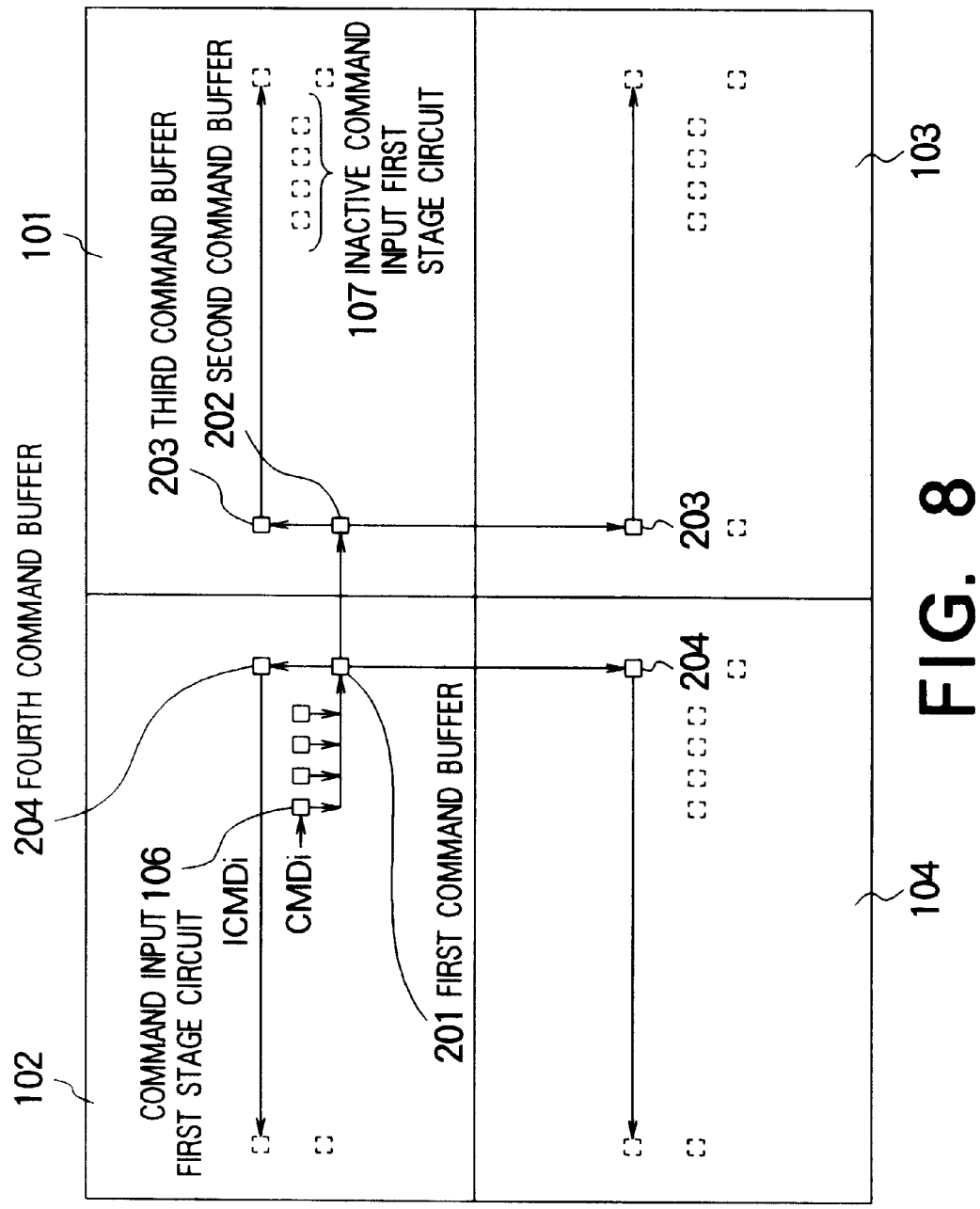
FIG. 8 is a block diagram showing a transmission path of a command signal according to a first embodiment of this invention.

Referring to FIG. 8, description will be made about a transmission path of a command signal according to the first embodiment.

As mentioned before, the four command input first stage circuits 106 are collectively arranged in the flexible macro chip 102. A command signals CMDi is given to the command input first stage circuits 106. In this event, the command input first stage circuits 106 are driven by the first internal clock signal ISCLK from the clock input first stage circuit 105, as illustrated in FIG. 7.

With such a structure, the command signal CMDi is supplied to the respective flexible macro chips 101 through 104 via a plurality of command buffers, as shown in FIG. 8. Herein the command buffers also constitutes a tree structure.

More specifically, the command signal CMDi is first supplied to a first command buffer 201. Further, the command signal CMDi is supplied from the first command buffer 201 into fourth command buffers 204 in the flexible macro chip 102 and 104. On the other hand, the command signal CMDi is supplied from the first command buffer 201 into a second command buffer 202 in the flexible macro chip 101. Further, the command signal CMDi is supplied from the second command buffer 202 into third command buffers 203 in the flexible macro chips 101 and 103.

In this event, the third and fourth command buffers 203 and 204 are driven by the internal reference clock signal ICLK illustrated in FIG. 6. Herein, it is to be noted that the tree structure of the internal reference clock ICLK in FIG. 6 is similar to the conventional tree structure illustrated in FIG. 2 except that the clock input first stage circuit 105 additionally supplies the first internal clock signal ISCLK in FIG. 6.

Figure 9:
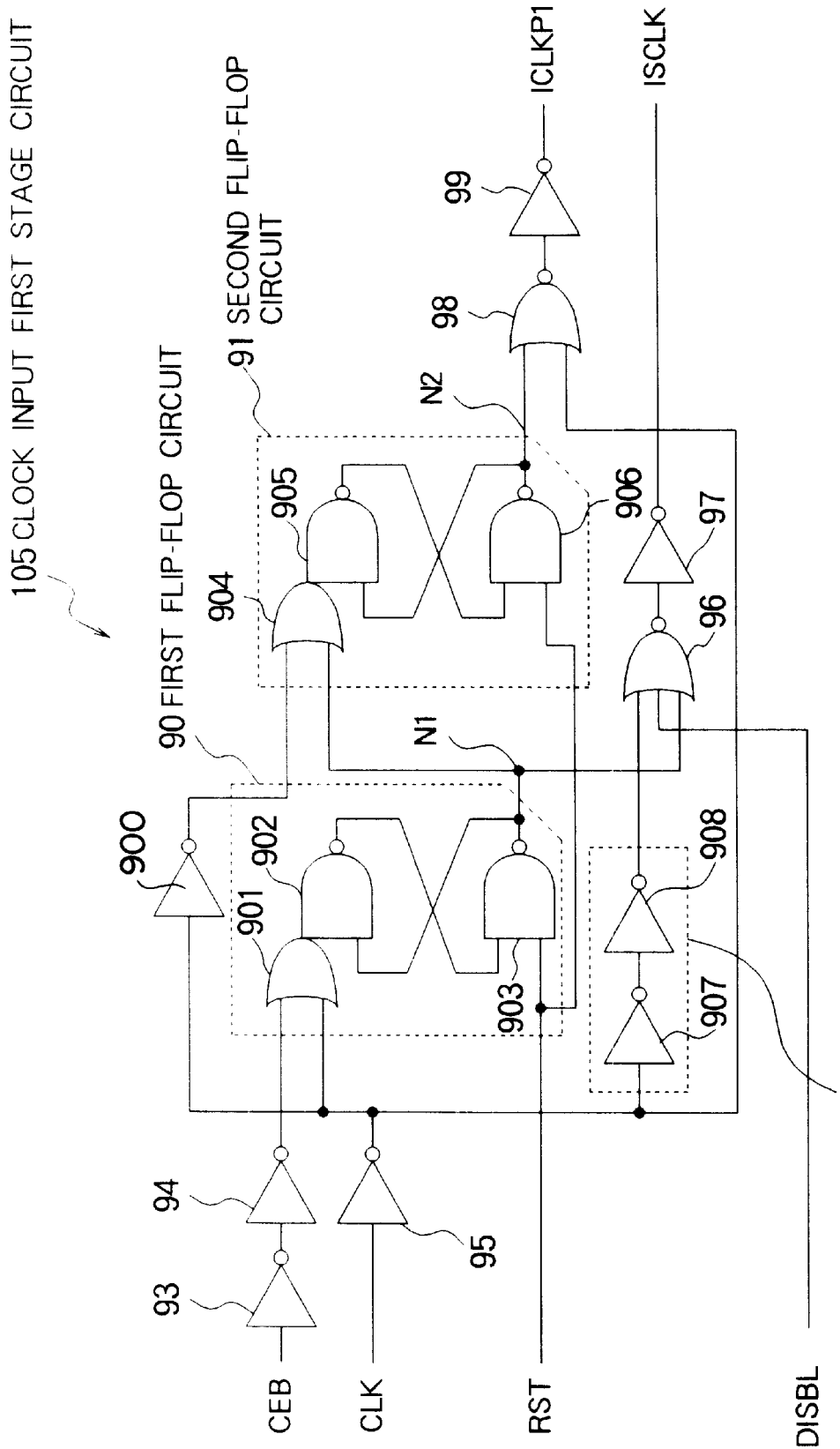
FIG. 9 is a circuit diagram showing a clock input first stage circuit according to a first embodiment of this invention.

The clock input first stage circuit 105 in FIG. 7 has a structure illustrated in FIG. 9. Specifically, the clock input first stage circuit 105 mainly includes a first flip-flop circuit 90, a second flip-flop circuit 91 and a first delay device 92. In addition, the clock input first stage circuit 105 has inverter circuits 93, 94, 95, 97, 99 and 900, and NOR circuit 96 and 98. In this case, the first flip-flop circuit is composed of an OR circuit 901, NAND circuits 902 and 903 while the second flip-flop circuit is composed of an OR circuit 904 and NAND circuits 905 and 906. Moreover, the first delay device is composed of two inverter circuits 907 and 908.

With such a structure, a chip enable signal CEB is given to the first flip-flop circuit 90 via the inverter circuits 93 and 94. The external reference clock signal CLK is given to the first flip-flop circuit 90 via the inverter circuit 95. Further a reset signal is given to the first flip-flop circuit 90. Moreover, an inactive signal DISBL is given to the NOR circuit 96.

Under this condition, the internal reference clock signal ICLKP1 is output from the second flip-flop circuit 91 via the NOR circuit 98 and the inverter circuit 99. Further, the first internal clock signal ISCLK is output from the first delay device via the NOR circuit 96 and the inverter circuit 97.

In this case, the first internal clock signal ISCLK and the signal ICLKPI are halted in a standby state. The signal ICLKPI is given before the buffer of the tree structure of the internal reference clock signal ICLK.

Figure 10:
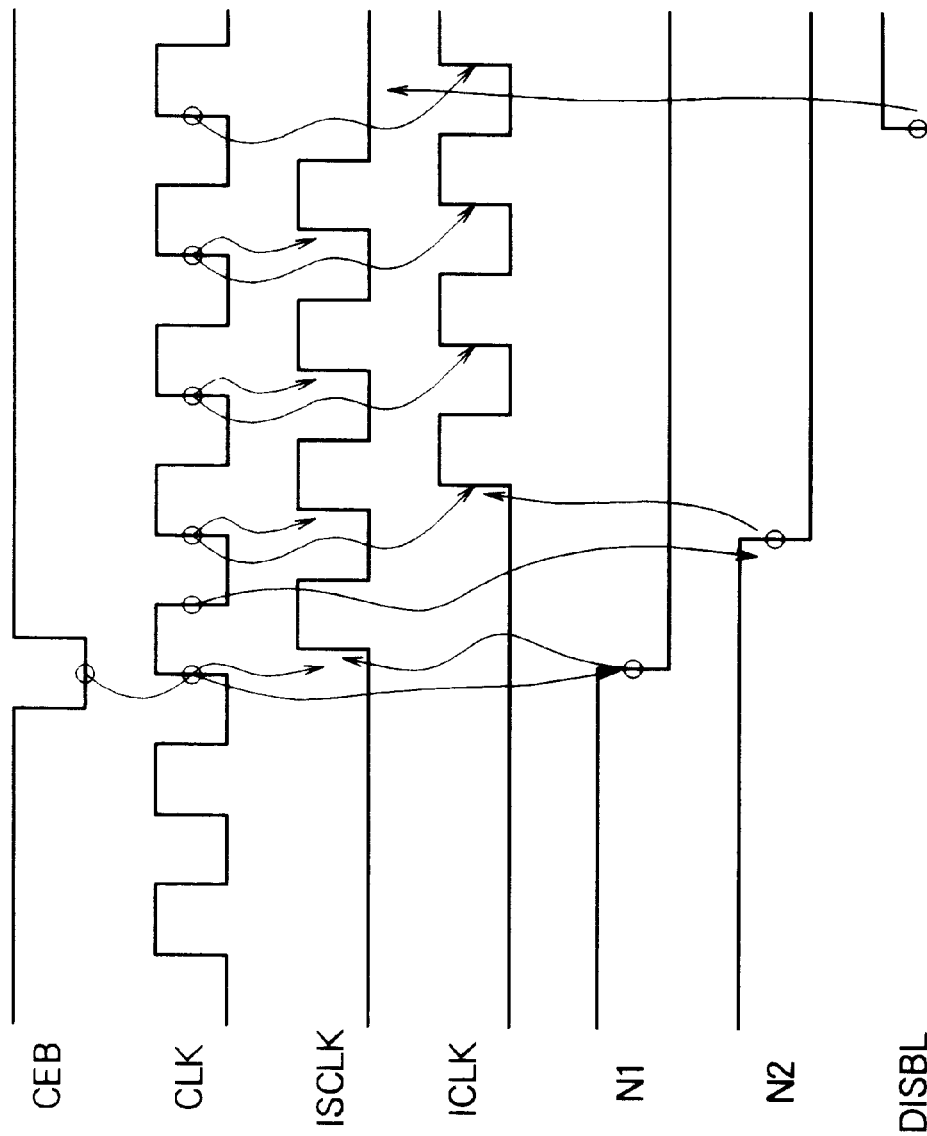
FIG. 10 is a timing chart showing the clock input first stage circuit illustrated in FIG. 9.

Subsequently, description will be made about a timing chart of the clock input first stage circuit 105 illustrated in FIG. 9, referring to FIG. 10.

When a chip enable CEB becomes a "Low" state, this state is latched in the first flip-flop circuit 90 at a rise timing of the clock signal. The first delay circuit 92 is inserted in the path between the external reference clock signal CLK and the first internal clock signal ISCLK with the required latch time. Therefore, the first internal clock signal ISCLK has the same clock width between the first cycle and the second cycle, as illustrated in FIG. 10.

On the other hand, the output Ni of the first flip-flop circuit 90 is given to the second flip-flop circuit 91 to reverse the second flip-flop circuit 91 at a fall time of the external reference clock signal CLK. Thereby, an output N2 of the second flip-flop circuit 91 becomes a "low" state. Consequently, the path between the external reference clock signal CLK and the signal ICLKPI is activated.

Therefore, the internal reference clock signal ICLK is operated from the second clock cycle. However, the command input first stage circuit 106 inputs the command signal at the first clock cycle and is supplied into the third and fourth command buffers 203 and 204 illustrated in FIG. 8. Accordingly, there is no problem with respect to the operation. Naturally, the clock width of the internal reference clock signal ICLK does not become narrow, as shown in FIG. 10.

Although the first internal clock signal ISCLK is delayed in the clock input first stage circuit 105 in the first embodiment, the first internal clock signal ISCLK is quicker than the internal reference clock signal ICLK. Consequently, the time permitted for the path between the command input first stage circuit 106 and the third command buffer 203 becomes longer than the case where both circuits are driven by the internal reference clock signal ICLK. Further, the first internal clock signal ISCLK is halted by the inactive signal DISBL after the command signal and the address signal are inputted.

Second Embodiment

Figure 11:
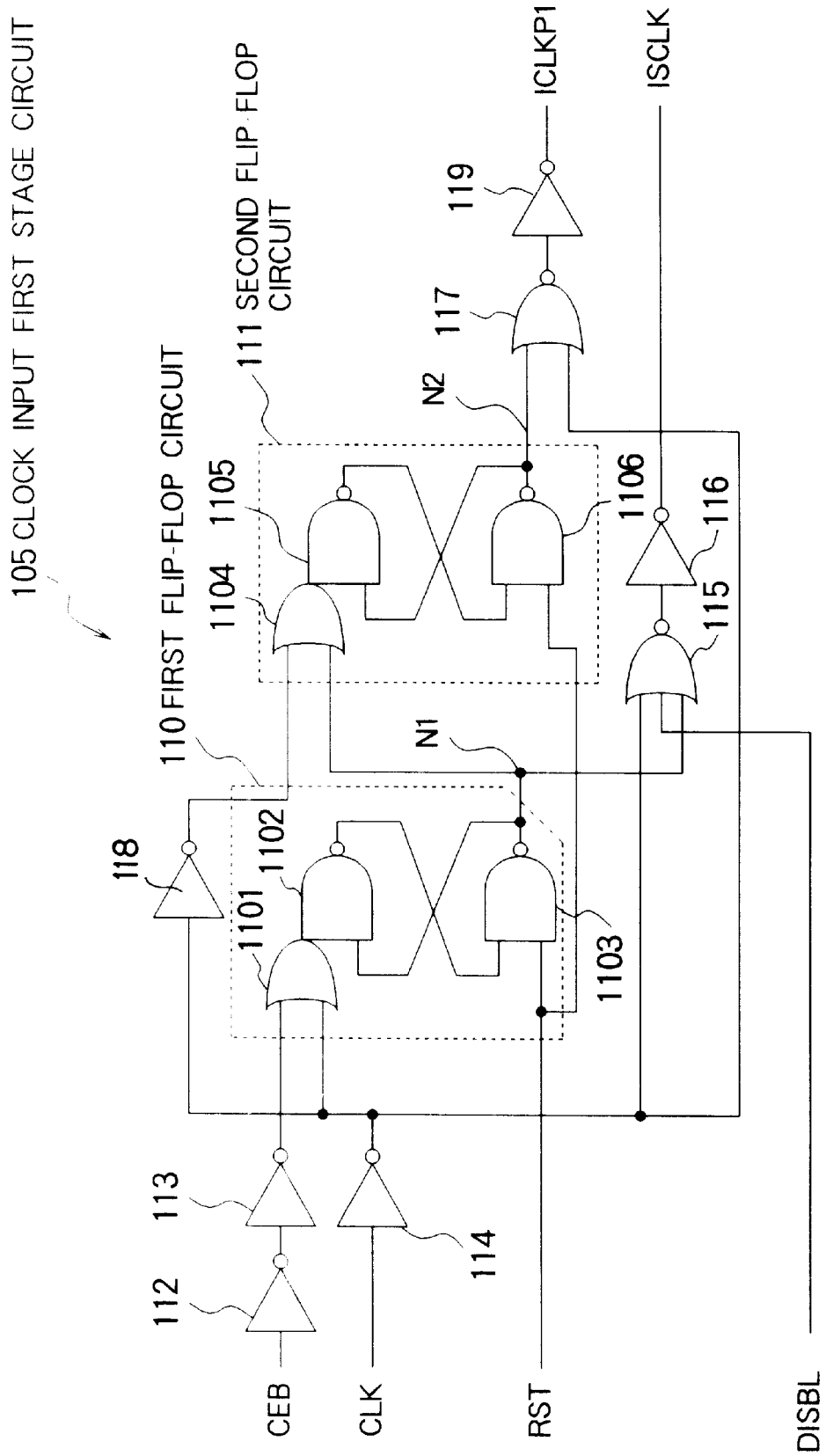
FIG. 11 is a circuit diagram showing a clock input first stage circuit according to a second embodiment of this invention.
Figure 12:
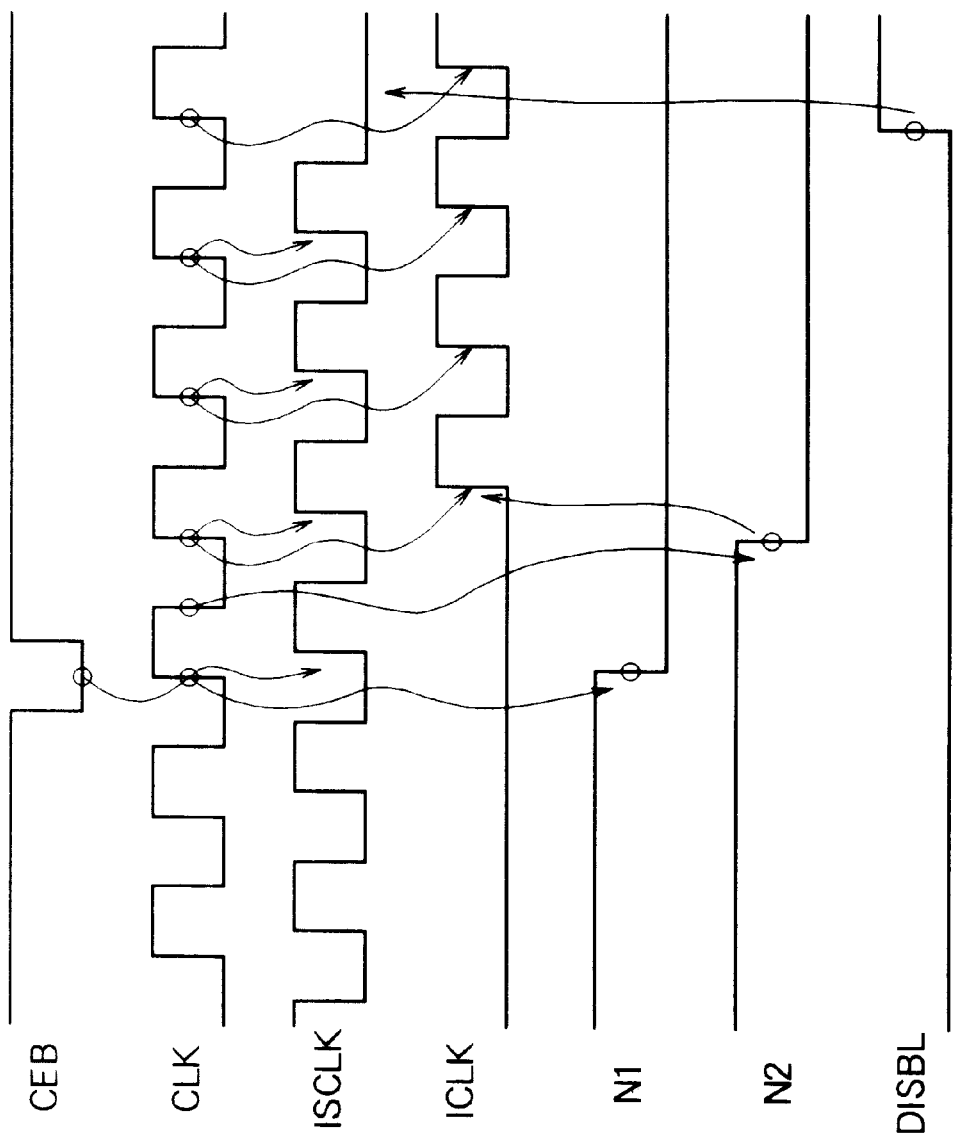
FIG. 12 is a timing chart showing the clock input first stage circuit illustrated in FIG. 11.

Referring to FIGS. 11 and 12, description will made about a second embodiment of this invention.

The second embodiment is similar to the first embodiment illustrated in FIG. 9 except that the first delay circuit 92 illustrated in FIG. 9 is removed.

Specifically, the clock input first stage circuit 105 mainly includes a first flip-flop circuit 110 and a second flip-flop circuit 111. In addition, the clock input first stage circuit 105 has inverter circuits 112, 113, 114, 116, 118 and 119, and NOR circuits 115 and 117. In this case, the first flip-flop circuit is composed of an OR circuit 1101, NAND circuits 1102 and 1103 while the second flip-flop circuit is composed of an OR circuit 1104 and NAND circuits 1105 and 1106.

With such a structure, a chip enable signal CEB is given to the first flip-flop circuit 110 via the inverter circuits 112 and 113. The external reference clock signal CLK is given to the first flip-flop circuit 110 via the inverter circuit 114. Further a reset signal RST is given to the first flip-flop circuit 110. Moreover, an inactive signal DISBL is given to the NOR circuit 115.

Under this condition, the internal reference clock signal ICLKP1 is output from the second flip-flop circuit 111 via the NOR circuit 117 and the inverter circuit 119. Further, the first internal clock signal ISCLK is output via the NOR circuit 115 and the inverter circuit 116.

In the second embodiment, the first internal clock signal ISCLK continues to be supplied in the standby state to keep the width of the first internal clock signal ISCLK constant, as illustrated in FIG. 12. Consequently, the standby current is increased only at the command input first stage circuit 106.

On the other hand, the first internal clock signal ISCLK appears quicker than the first embodiment, as illustrated in FIG. 12. Therefore, the time permitted for the path between the command input first stage circuit 106 and the third command buffer 303 becomes longer than the first embodiment.

Likewise, the first internal clock signal ISCLK is halted by the DISBL signal in the second embodiment after the command signal and the address signal are input, as shown in FIG. 12. However, when the operation mode is reset to transfer to the standby state, the DISBL signal is released to start the operation of the first internal clock signal ISCLK.

Third Embodiment

Subsequently, description will be made about a third embodiment of this invention, referring to FIGS. 13 and 14.

Figure 13:
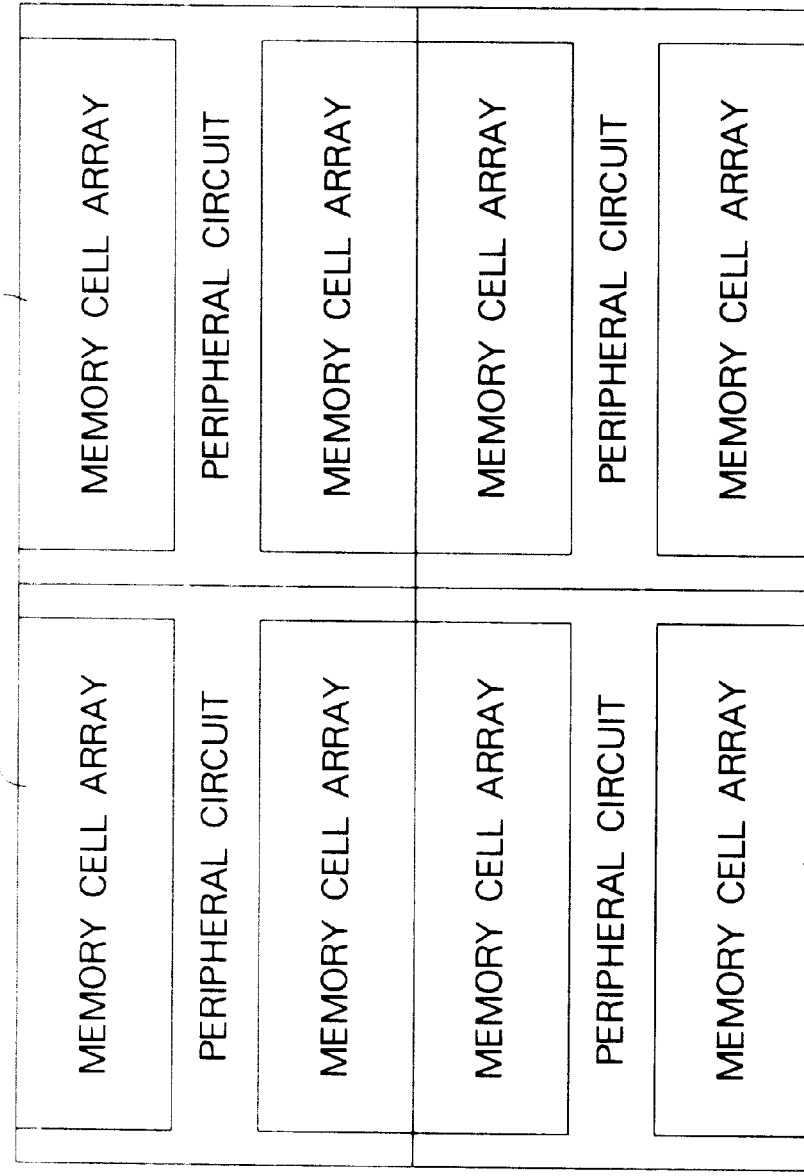
FIG. 13 is a layout showing a chip structure according to a third embodiment of this invention.

The memory chip is grouped into four flexible macro chips 801 through 804, as illustrated in FIG. 13. In this case, each of the flexible macro chips 801 through 804 has two memory cell arrays and a peripheral circuit, like the memory chip illustrated in FIG. 1. In this event, the memory chip in FIG. 13 is similar to the memory chip in FIG. 1 except that no wiring areas are placed at one side of the memory chip to reduce the chip area in FIG. 13.

Figure 14:
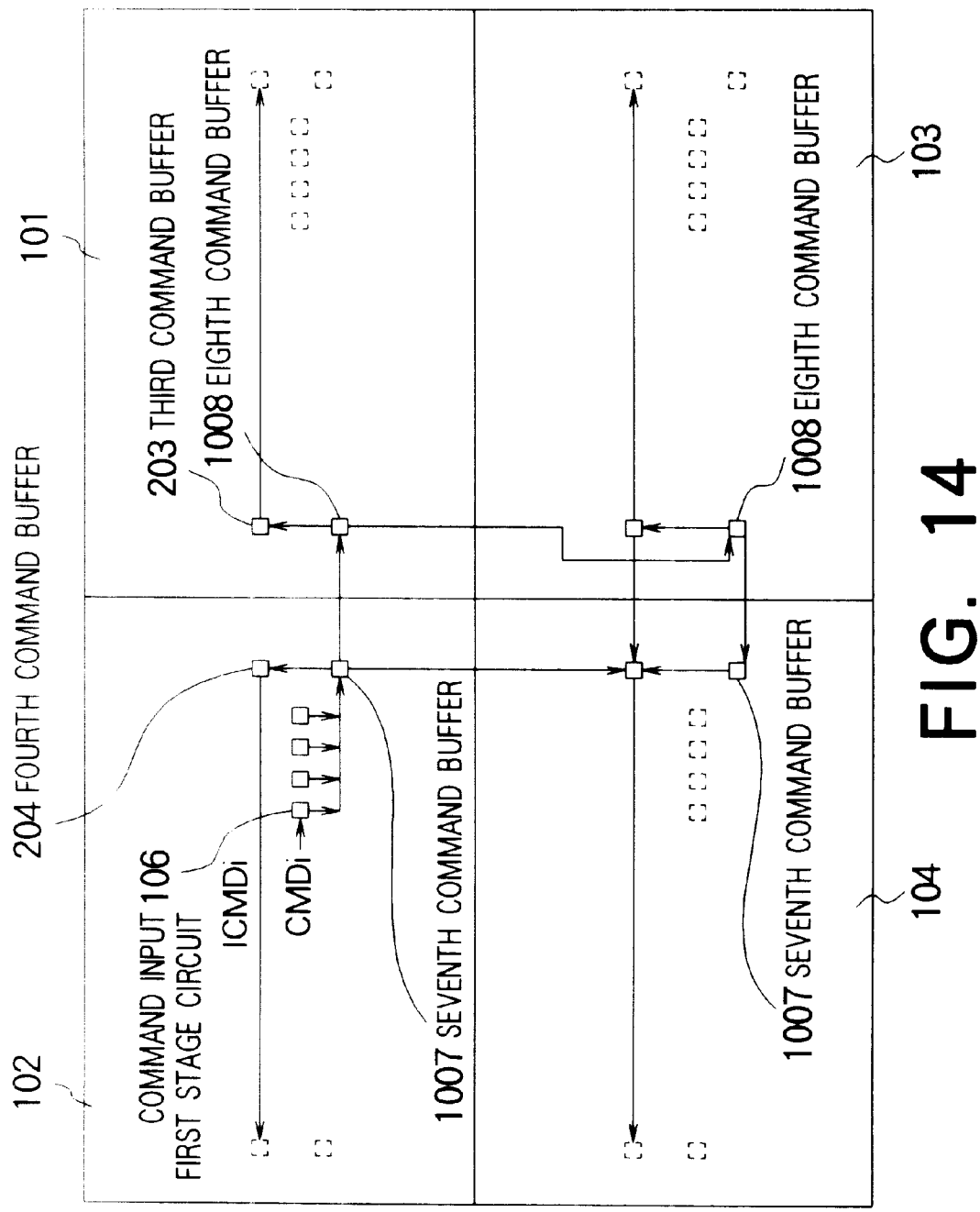
FIG. 14 is a block diagram showing a transmission path of a command signal according to a third embodiment of this invention.

Referring to FIG. 14, description will be made about a transmission path of a command signal according to the third embodiment.

As mentioned before, the four command input first stage circuits 106 are collectively arranged in the flexible macro chip 102. A command signal CMDi is given to the command input first stage circuits 106. In this event, the command input first stage circuits 106 are driven by the first internal clock signal ISCLK from the clock input first stage circuit 105, like in FIG. 8.

With such a structure, the command signal CMDi is supplied to the respective flexible macro chips 101 through 104 via a plurality of command buffers, as shown in FIG. 14. Herein the command buffers constitutes a tree structure.

More specifically, the command signal CMDi is first supplied to a seventh command buffer 1007 in the flexible macro 102. Further, the command signal CMDi is supplied from the seventh command buffers 1007 in the flexible macro chip 102 into a fourth command buffer 204 in the flexible macro chip 102.

On the other hand, the command signal CMDi is supplied from the seventh command buffer 1007 in the flexible macro 102 into eighth command buffers 1008 in the flexible macro chips 101 and 103.

Further, the command signal CMDi is supplied from the eighth command buffer 1008 in the flexible macro chip 101 into a third command buffer 203 in the flexible macro chip 101 while the command signal CMDi is supplied from the eighth command buffer 1008 in flexible macro chip 103 into a seventh command buffer 203 in the flexible macro chip 104.

In FIG. 14, there is no transmission path between the flexible macro chip 102 and the flexible macro chip 104 different from the command transmission path illustrated in FIG. 8. As mentioned before, the command signal CMDi is supplied to the flexible macro chip 104 via the flexible macro chips 101 and 103, as illustrated in FIG. 14. In contrast, the command signal CMDi is directly supplied from the flexible macro chip 102 into the flexible macro chip 104 in FIG. 8.

Thus, the transmission path illustrated in FIG. 14 is adopted in the memory chip so that the chip area can be largely reduced, as illustrated in FIG. 13. This is because it is unnecessary to prepare areas for signal lines which directly connect the flexible macro chip 102 with the flexible macro chip 104, like in the FIG. 8.

In this event, the command signal CMDi is once collected to the flexible macro chips 101 and 103 of the one side of the memory chip. Consequently, enough time is required to supply the command signal CMDi because the path becomes long as compared to the first embodiment illustrated in FIG. 8. However, no problem is caused to occur because the output from the command input first stage circuit 106 is quicken by the use of the first internal clock signal ISCLK.

Fourth Embodiment

Subsequently, description will be made about a fourth embodiment of this invention, referring to FIG. 15.

In the semiconductor memory device of the flexible multi-macro system, each of the plurality of flexible macro chips independently operates before cutting fuses.

Figure 15:
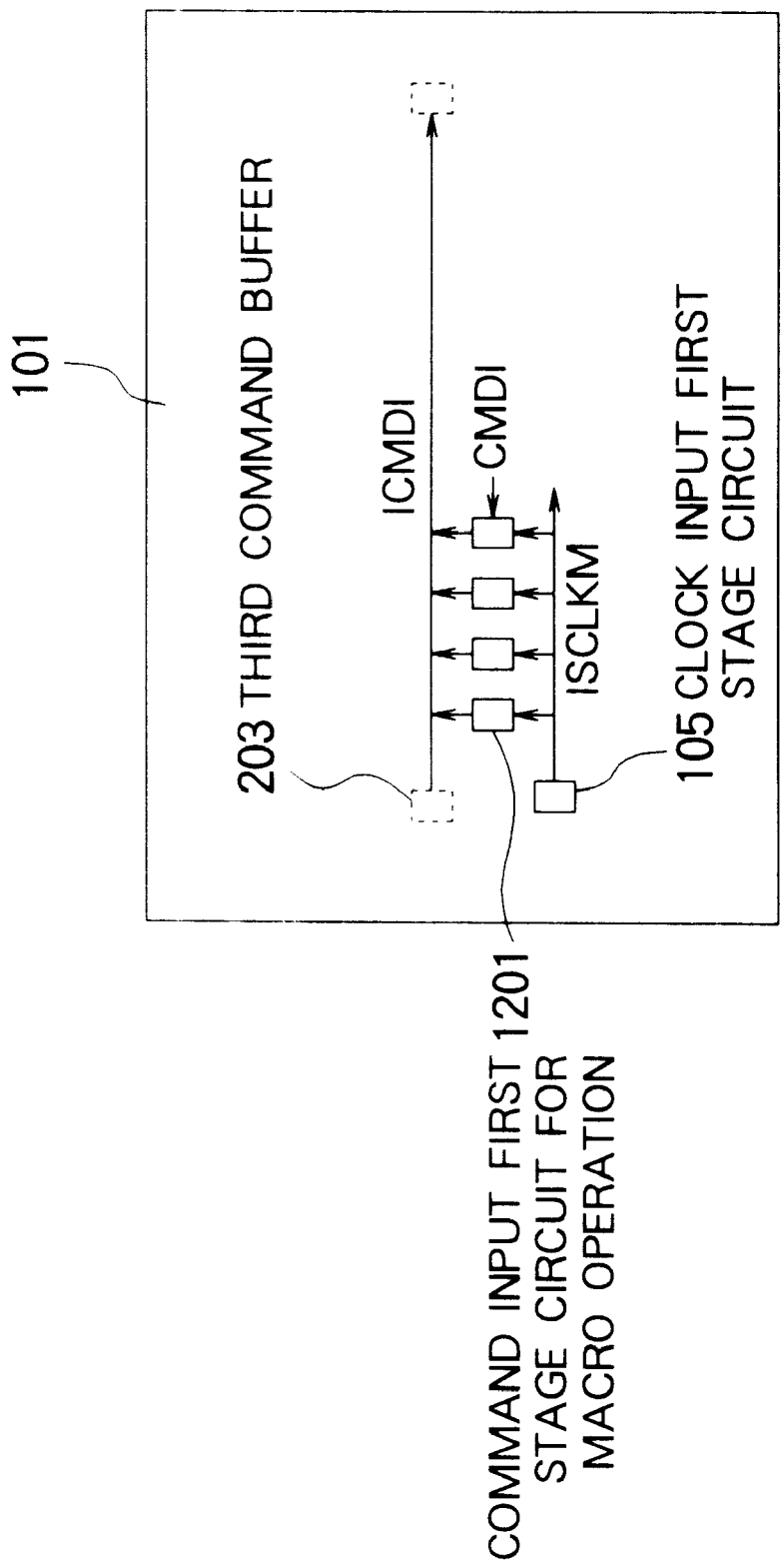
FIG. 15 is a block diagram showing a transmission path of a command signal during an macro operation according to a fourth embodiment of this invention.

As shown in FIG. 15, the clock input first stage circuit 105 is arranged in the flexible macro chip 101. Further, the command input first stage circuit 1201 for the macro operation are collectively provided in the flexible macro 101. In this event, second internal clock signals ISCLKM are directly given to the command input first stage circuits 1201 from the clock input first stage circuit 105. The command input first stage circuits 1201 are driven by the second internal clock signals ISCLKM.

With such a structure, the command signal CMDi is given to the command input first stage circuits 1201 to supply the internal command signal ICMDi into a third command buffer 203.

In this event, when the memory chip is operated by combining the flexible macro chips 101 through 104 as the DRAM of IG bit, the first internal clock signal ISCLK is directly given to the command input first stage circuit 106, as illustrated in FIG. 7. On the other hand, when the memory chip is operated by exclusively or independently using the flexible macro chip 101 itself as the DRAM of 256 M bit, the second internal clock signal ISCLKM is directly given to the command input first stage circuit 1201, as illustrated in FIG. 15.

Thus, the second internal clock signal ISCLKM is exclusively used for the macro operation. Further, the second internal clock signal ISCLKM is given to the command input first stage circuit 1201 for the macro operation, as mentioned before. Herein, the command input first stage circuit 1201 is generally composed of two stage of D-type flip-flops (not shown).

In this event, the command signal CMDi waits during one clock, which is consumed between the command input first stage circuit 105 and the third command buffer 203 during the full chip operation in the command input first stage circuit 1201. Therefore, the operation specification in the full chip is substantially equal to that of the macro operation.

Further, the command input first stage circuits 1201 are generally arranged at the opposite side of the command input first stage circuit 106 on the condition that the center of the chip is interposed. Thereby, the command input first stage circuit 1201 and the command input first stage circuit 106 are arranged adjacent to the clock input first stage circuit 105 without increasing the concentration of the wiring lines between blocks. Herein, it is not to say that the clock width does not become narrow by separating the internal reference clock signal ICLK and the first internal clock signal ISCLK in the macro operation.

What is claimed is:

1. A semiconductor memory device grouped into a plurality of flexible macro chips, the device comprising:
    a clock input first stage circuit that is arranged in a first flexible macro chip and supplies an internal reference clock signal and a first internal clock signal in response to an external reference clock signal; and
    a group of command input first stage circuits that are collectively arranged in a second flexible macro chip different from said first flexible macro chip and directly receive the first internal clock signal from the first stage circuit to input a command signal.

2. The device as claimed in claim 1, further including a plurality of tree structured clock buffers, the internal reference clock signal being supplied into each of said flexible macro chips via said clock buffers.

3. The device as claimed in claim 1, further including a plurality of tree structured command buffers, the command signal being supplied into each of said flexible macro chips via said command buffers.

4. The device as claimed in claim 1, wherein each of said first and second flexible macro chips includes a memory cell array and a peripheral circuit.

5. The device as claimed in claim 1, wherein said clock input first stage circuit is activated only in said first flexible macro chip.

6. The device as claimed in claim 1, wherein said command input first stage circuits are activated only in said second flexible macro chip.

7. The device as claimed in claim 1, wherein said clock input first stage circuit further supplies a second internal signal, and
    the second internal signal is directly supplied to said command input first stage circuits,
    the command signal is applied to said command input first stage circuits in response to the first internal signal when said plurality of flexible macro chips are combined, while the command signal is applied to said command input first stage circuit in response the second internal signal when any one among flexible macro chips is independently operated.

8. A semiconductor memory device grouped into a plurality of flexible macro chips, the device comprising:
    a clock input first stage circuit that is arranged in a first flexible macro chip and supplies an internal reference clock signal and a first internal clock signal in response to an external reference clock signal; and
    a group of command input first stage circuits that are collectively arranged in a second flexible macro chip different from said first flexible macro chip and directly receive the first internal clock signal from the first stage circuit to input a command signal,
    wherein said clock input first stage circuit includes a first flip-flop circuit, a second flip-flop circuit connected to said first flip-flop circuit, and a delay device, wherein the external reference clock signal, a chip enable signal, and a reset signal are applied to said first flip-flop circuit.

9. The device as claimed in claim 8, wherein the first internal clock signal is halted in a stand-by state, which is ready to input the command signal.

10. The device as claimed in claim 8, wherein the first internal clock signal is halted except during an operation mode.

11. The device as claimed in claim 8, wherein the internal reference clock signal is generated from a second clock cycle.

12. A semiconductor memory device grouped into a plurality of flexible macro chips, the device comprising:
    a clock input first stage circuit that is arranged in a first flexible macro chip and supplies an internal reference clock signal and a first internal clock signal in response to an external reference clock signal; and
    a group of command input first stage circuits that are collectively arranged in a second flexible macro chip different from said first flexible macro chip and directly receive the first internal clock signal from the first stage circuit to input a command signal,
    wherein said clock input first stage circuit includes a first flip-flop circuit and a second flip-flop circuit connected to said first flip-flop circuit,
    wherein the external reference clock signal, a chip enable signal and a reset signal are input to said first flip-flop circuit.

13. The device as claimed in claim 12, wherein the first internal clock signal is supplied in a standby state, which is ready to input the command signal.

14. The device as claimed in claim 12, wherein the first internal clock signal is halted except during an operation mode.

15. The device as claimed in claim 12, wherein the internal reference clock signal is generated from a second clock cycle.

* * * * *